United States Patent [19]
Siniscalchi et al.

[11] Patent Number: 5,994,926
[45] Date of Patent: Nov. 30, 1999

[54] CIRCUIT AND METHOD FOR PROGRAMMABLY CHANGING THE TRANSCONDUCTANCE OF A TRANSCONDUCTOR CIRCUIT

[75] Inventors: Patrick P. Siniscalchi, Sachse; Davy H. Choi; William R. Krenik, both of Garland, all of Tex.

[73] Assignee: Texas Instruments Incorporated, Dallas, Tex.

[21] Appl. No.: 08/838,300

[22] Filed: Apr. 16, 1997

Related U.S. Application Data

[60] Provisional application No. 60/016,437, Apr. 29, 1996.

[51] Int. Cl.[6] ................................................. H03K 5/22
[52] U.S. Cl. ........................................................ 327/65
[58] Field of Search ................................ 327/52, 56, 63, 327/65, 69, 72, 77–83, 89, 90, 561, 563; 330/252; 365/205, 207, 208

[56] References Cited

U.S. PATENT DOCUMENTS

| 4,663,594 | 5/1987 | Perkins | 330/261 |
| 5,355,391 | 10/1994 | Horowitz et al. | 375/36 |
| 5,552,742 | 9/1996 | Perkins | 327/563 |
| 5,663,690 | 9/1997 | McGinn | 331/109 |
| 5,729,230 | 3/1998 | Jensen et al. | 341/143 |

*Primary Examiner*—My-Trang Nu Ton
*Attorney, Agent, or Firm*—W. Daniel Swayze, Jr.; Wade James Brady, III; Richard L. Donaldson

[57] ABSTRACT

A programmably variable transconductance circuit (10) and method for varying its transconductance includes first and second current control input devices (16, 18), each having an input (17,19) to which a differential input voltage may be applied. A pair of current steering circuits (26, 28, 30, 32) are each connected in series with a respective one of the first and second current control devices (16, 18) for dividing respective currents in the first and second current control devices (16, 18) between a differential output current path (12, 14) and another current flow path, and a programmable voltage source (90) supplying $V_{CONTROL}$ is connected to control the current division by the current steering circuits (26, 28, 30, 32). The programmable voltage, $V_{CONTROL}$, is provided by a programmable current control loop (90), which incorporates a master transconductance circuit, to establish a constant transconductance independently of temperature variations. A dynamically controllable resistance, such as an MOS transistor (24), or the like, is connected between the first and second current control input devices (16, 18), and a second voltage source ($V_{GATE}$) is connected to the dynamically controllable resistance (24) to maintain the dynamically controllable resistance (24) at a constant value.

22 Claims, 3 Drawing Sheets

CIRCUIT AND METHOD FOR PROGRAMMABLY CHANGING THE TRANSCONDUCTANCE OF A TRANSCONDUCTOR CIRCUIT

This application claims priority under 35 USC §119(e)(1) of provisional application Ser. No. 60/016,437 filed Apr. 29, 1996.

BACKGROUND OF THE INVENTION

1. Field of the Invention

This invention relates to improvements in circuits and methods for providing a programmable differential current output from a differential voltage input, and more particularly to improvements in programmable differential transconductance circuits.

2. Relevant Information

Transconductance circuits are circuits that change a voltage into a current, and have many uses. For example, transconductance circuits are used in motor driver applications, such as for hard disk drives, or the like, or for filter applications, and so on. Typically, in filter applications, one of the design considerations is the ability to programmably adjust the range of frequencies that are passed or rejected by the filter, which can be controlled by varying the currents applied to the filter in known manner.

Generally the currents that are applied to the filter are provided by transconductance circuits. However, because of limitations in the transconductance circuit designs, the frequency range over which the filter could be adjusted has been limited to about three times the center or cutoff frequency. This limitation has primarily been due to the range over which the transconductance circuit associated with the filter can be reliably operated.

One transconductance circuit which has been used employs a resistor connected between emitters of bipolar transistors that are connected in respective current steering paths. The resistor is sometimes referred to as a "degenerating resistor." An input control voltage controls the current steering paths to direct current between output current paths and a supply current path. The input signal is applied to the respective bases of the bipolar transistors in the current steering paths. One of the problems in the construction of this type of transconductance circuit, however, is that the particular value of the resistor used to interconnect the steering paths is critical. When an integrated circuit implementation is used, the value of the resistor is usually adjusted by laser trimming techniques, in order to overcome the typical integrated circuit processing variations, which may be as high as ±30%. Laser trimming, however, requires expensive equipment to perform, is time consuming, must be performed on the resistors of each transconductance circuit, and adds greatly to the final cost of the circuit.

Not only do resistor embodiments require laser trimming and other expensive procedures, but resistors used in integrated circuits in the transconductance steering current paths typically are also undesirably temperature dependent. For example, a typical resistor in the transconductance circuit environment of the type described may have a temperature coefficient of up to ±1%/° C. Thus, over a large temperature range which may typically be encountered in an environment in which transconductance circuits and their associated circuitry may be employed renders such resistor embodiments generally unsatisfactory for use.

To address these problems, circuits have been suggested that employ a number of input stages, with each stage being switchably connected to the main transconductance circuit. The circuits include multiple MOS devices interconnecting the various steering current paths, the various steering current paths being connected in parallel so that the binary sum of the individual contributions of the MOS transistors provides the necessary current control, as determined by the circuit switches.

This embodiment, however, has several limitations, including the resolution that is achievable and, in general, the current range over which the transconductance operation of the circuit can perform. In a filter embodiment, for example, this results in a limitation on the range of frequencies over which the filter can be programmably controlled.

In this embodiment, the MOS transistors are generally operated in a linear operating range between the respective current steering paths in which they are connected. The voltage on the gate of the respective MOS transistors is controlled by a circuit that makes the transconductance of the circuit utilizing this linear region MOS transistor to be relatively temperature independent, but as indicated, the range over which the transconductance current can be controlled is not as great as might be desired in many applications. An example of a circuit for providing a control voltage for application to the gates of the various MOS transistors is shown in U.S. Ser. No. 08/430,218, assigned to the assignee hereof, and incorporated herein by reference.

Another problem of transconductance circuits of this type is that they occupy a large area in an integrated circuit, which can be undesirable in many applications. In addition, because of the number of individual circuits that are switched into and out of the current steering paths, the offsets that are generated in the circuit can be problematic.

What is needed, therefore, is a method and apparatus for providing a programmable transconductance that has a wide range of transconductance, requires little integrated circuit "real estate", and is process and temperature independent.

SUMMARY OF THE INVENTION

In light of the above, therefore, it is an object of the invention to provide a method and apparatus for providing a transconductance circuit that provides a wide programmable range of transconductance, and is relatively process and temperature independent.

Thus, according to a broad aspect of the invention, a programmably variable transconductance circuit is provided. The circuit includes first and second current control input devices, each having an input to which a differential input voltage may be applied. A pair of current steering circuits are each connected in series with a respective one of the first and second current control devices for dividing respective currents in the first and second current control devices between a differential output current path and another current flow path, and a programmable voltage source is connected to control the current division by the current steering circuits. A dynamically controllable resistance, such as an MOS transistor, or the like, is connected between the first and second current control input devices, and a second voltage source is connected to the dynamically controllable resistance to maintain the dynamically controllable resistance at a constant value.

According to another broad aspect of the invention, a circuit for providing a programmably variable transconductance is provided. The circuit includes first and second current flow paths and first and second current control devices respectively connected to control currents in the first and second current flow paths. Each of the first and second current control devices has a control input element to which a differential input voltage may be applied. A pair of current steering circuits are each connected in series with a respective one of the first and second current flow paths. Each of the current steering circuit are connected to divide a current in the respective one of the first and second current flow paths between a respective output current path and another current flow path. A first voltage source is connected to programmably control the division of the pair of current steering circuits. A dynamically controllable resistance connected between the first and second current flow paths is controlled by a second voltage control source connected to maintain the dynamically controllable resistance to provide a constant resistance over desired operating transconductance ranges.

According to yet another broad aspect of the invention, a method is provided for programmably varying a transconductance of a circuit. The method includes steering first and second input voltages between a respective first and second differential output current path and another current flow path, and programmably controlling the current division. The method also includes dynamically controlling a resistance between the first and second differential output current paths to provide a constant value.

BRIEF DESCRIPTION OF THE DRAWINGS

The aforementioned and other features and objects of the present invention and the manner of attaining them will become more apparent, and the invention itself will be best understood, by reference to the following description of a preferred embodiment take in conjunction with the accompanying drawings, wherein.

In the various figures of the drawings, like reference numerals are used to denote like or similar parts.

DETAILED DESCRIPTION OF THE PREFERRED EMBODIMENTS

Figure 1:
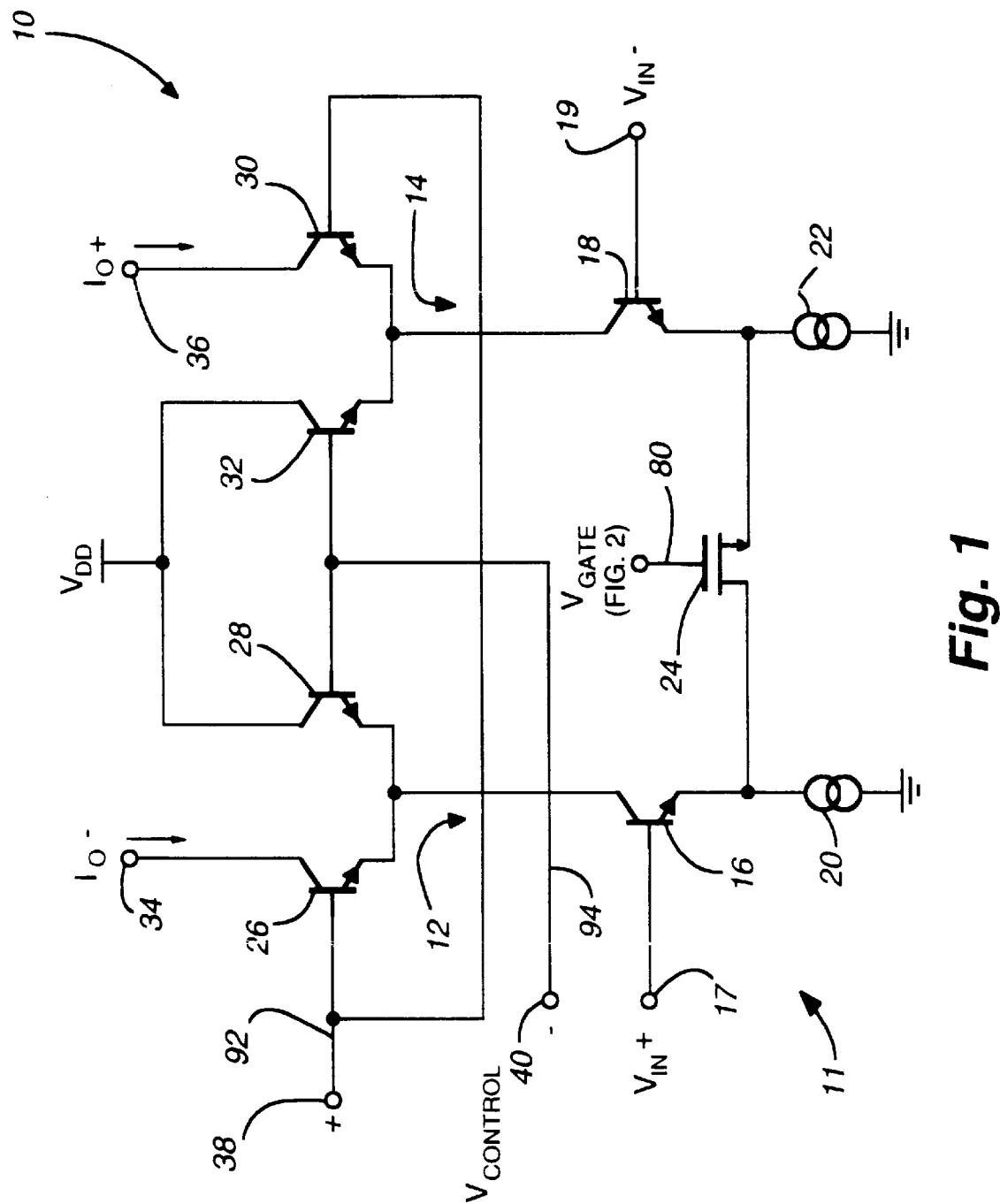
FIG. 1 is an electrical schematic diagram of a transconductance circuit constructed in accordance with a preferred embodiment of the invention.

An electrical schematic diagram of a transconductance circuit 10 in accordance with the preferred embodiment of the invention is shown in FIG. 1. The transconductance circuit 10 has an input section 11, which includes two current paths 12 and 14, each of which contains a respective series connected NPN transistor 16 and 18 to control the current therein. The transistors 16 and 18 are matched to have the same electrical and thermal characteristics.

In addition, a pair of matched current sources 20 and 22 are respectively connected between the emitters of the NPN transistors 16 and 18 and a reference potential, such as a ground potential shown. The current sources 20 and 22 are constructed to be relatively temperature independent. The input voltage to the circuit is differentially connected to the respective bases of the NPN transistors 16 and 18 on input terminals 17 and 19. The input signal applied to the bases of the input transistors 16 and 17 may, of course, be an AC signal.

The emitters of the two input NPN transistors 16 and 18 are interconnected by an MOS transistor 24. The MOS transistor 24 has a voltage applied to its gate to cause it to operate in its linear region. Moreover, as will be seen, the voltage applied to the gate of the MOS transistor 24 is configured so that the resistance provided by the MOS transistor 24 is essentially constant over the operating range of the circuit 10, despite process variations that may be experienced by the circuit 10 during its construction and temperature variations to which the circuit may be exposed in its operation. The voltage applied to the gate of the MOS transistor is developed by a circuit 50, described more fully below. The determination of the particular resistance that is provided by the MOS transistor 24 is established depending upon the particular circuit application in which the transconductance circuit 10 is employed.

It will be appreciated that since the resistance of the MOS transistor 24 can be specifically and precisely controlled by control of the voltage applied to its gate, the precision resistor trimming requirements of the prior art are not required in the construction or initial set up of the circuit 10. In addition, the resistance of the MOS transistor 24 is essentially independent of the temperature of the transistor 24, with its resistance being much larger than the individual resistances of the input transistors 16 and 18.

In each current path 12 and 14, steering transistors 26 and 30 and steering transistors 28 and 32 are connected respectively to the current output terminals 34 and 36 of the circuit 10 and a supply voltage, $V_{DD}$. It should be noted that transistors 26, 28, 30, and 32 are matched, which is relatively easy to accomplish in construction of the circuit 10.

More specifically, two NPN transistors 26 and 28 are connected in the first current path 12, the NPN transistor 26 being connected in series between the NPN transistor 16 and the negative output terminal 34 of the current path 12, and the NPN transistor 28 being connected between the NPN transistor 16 and $V_{DD}$. Similarly, the NPN transistor 30 is connected in series with the NPN transistor 18 and the positive current output terminal 36 of the second current path 14, with the other NPN transistor 32 connected in series with the NPN transistor 18 and $V_{DD}$. The respective bases of the NPN bipolar transistors 26 and 30 connected to the differential output terminals 34 and 36 are connected to the "+" side of the differential voltage input, $V_{CONTROL}$. On the other hand, the respective bases of transistors 28 and 32 are connected to the differential "−" terminal of the differential voltage input, $V_{CONTROL}$.

Therefore, the voltage input, $V_{CONTROL}$, applied to the respective terminals 38 and 40 controls ratio or division of the current in the current flow paths 12 and 14 that flows to the supply voltage, $V_{DD}$, or to the output terminals 34 and 36. Thus, depending upon the control voltage, $V_{CONTROL}$, the particular steady state transconductance current can be controlled, and upon which the signal that is applied to the respective bases of the input transistors 16 and 18 is superimposed.

Thus, the transconductance of the circuit 10 shown in FIG. 1 can be programmably controlled by programmably varying the control voltage, $V_{CONTROL}$, that is applied to the control voltage terminals 38 and 40 on lines 92 and 94. The circuit for providing and controlling the control voltage, $V_{CONTROL}$, is described below with reference to FIG. 3. Thus, for example, if an infinitely variable control voltage, $V_{CONTROL}$, were to be applied to the voltage control terminals 38 and 40, the transconductance circuit of FIG. 1 will provide an infinitely variable current output on the output terminals 34 and 36.

Another characteristic of the circuit 10 should be noted. The signal input paths on the bases of respective input transistors 16 and 18, the output at the respective current output terminals 34 and 36, and the control voltage that is applied to the terminals 38 and 40 to steer the current in the respective current steering paths are all differential inputs. Several advantages flow from the differential nature of the circuit 10. Since the input to signal the circuit 10 are not referenced to ground or $V_{DD}$, the circuit has a very good power supply rejection ratio (PSRR), and, additionally, has the potential of providing a very high bandwidth to the input signals. The transconductance circuit 10 of FIG. 1 may be connected to an active frequency filter, drivers for a motor circuit, or other appropriate circuit, in known manner.

It should be noted that in the context of a frequency filter with which the transconductance circuit 10 may be employed, the circuit 50 can be thought of as providing a voltage $V_{GATE}$ that establishes operating characteristics of the circuit 10 at a fixed frequency, and the circuit 90 can be thought of as providing the frequency programming to the circuit 10. As will become apparent, the circuit 50 is tuned by adjusting the voltage VREF at the bases of input transistors 68 and 72 and the current 2IA in the current path 52. On the other hand, the circuit 90 is programmed by varying the currents $I_{TUNE}$ of current sources 96 and 98.

Figure 2:
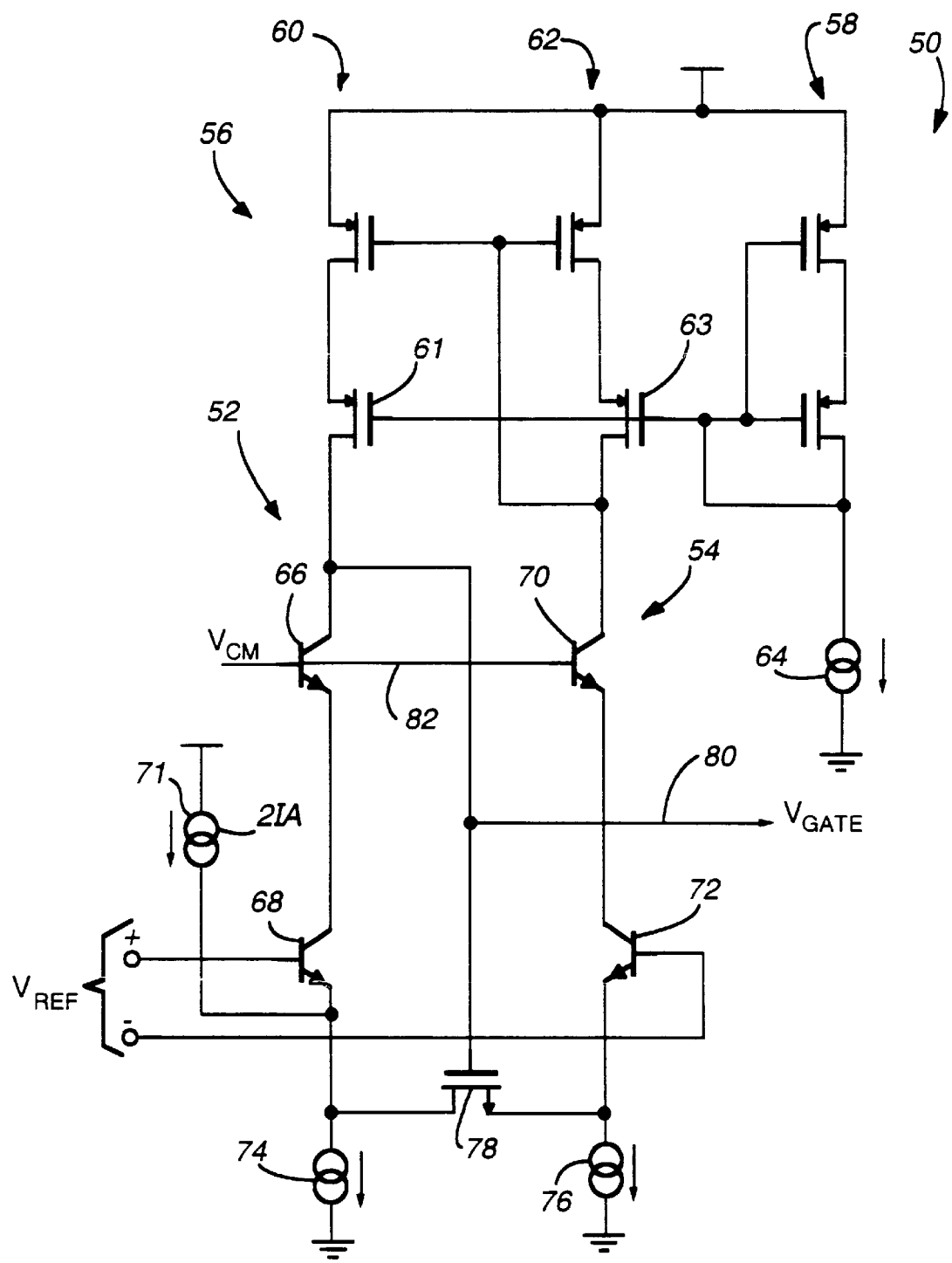
FIG. 2 is an electrical schematic diagram of a circuit for controlling the voltage on the MOS transistor interconnecting the current steering paths of the transconductance circuit of FIG. 1.

One circuit 50 for providing the gate voltage ($V_{GATE}$) to the MOS transistor 24 of the transconductance circuit 10 of FIG. 1 is shown in FIG. 2. The circuit 50 includes two current paths 52 and 54 in which current is controlled by a current mirror control circuit 56. Branch 60 mirrors the current in branch 62. In addition, branch 58 establishes the bias for the two lower p-channel MOS devices 61 and 63 in respective branches 60 and 62.

Each current flow path 52 and 54 has two respective NPN transistors 66 and 68 and NPN transistors 70 and 72 connected in series, the series being connected respectively to current sources 74 and 76. The NPN transistors 66 and 70 serve to increase the output impedance on output line 80, which, in turn, increases the gain of the control loop. The NPN transistors 66 and 70 are biased by a voltage $V_{CM}$, which causes the NPN transistors 66 and 70 to essentially replicate the effects of the transistors 26, 28, 30, and 32, in the circuit 10 of FIG. 1.

Thus, the current that flows in current flow paths 52 and 54 will be essentially identical in a steady-state. An MOS transistor 78 is connected between the emitters of the transistor 68 and 72, as shown, with the gate of the MOS transistor 78 being connected to the collector of the NPN transistor 66. The voltage that is developed on the gate of the transistor 78 provides the gate voltage ($V_{GATE}$) on line 80 to the MOS transistor 24 of the transconductance circuit 10 of FIG. 1. By virtue of the high swing cascode current mirror circuit that includes the MOS transistors 61 and 63, $V_{GATE}$ is enabled to assume a value very close to the supply voltage. Moreover, since a current is supplied by current source 71 of 2IA, using Kirchoff's current laws, it can be seen that the current through the MOS transistor 78 will be IA. Thus, the voltage on line 80 will vary on the gate of the MOS transistor 78 to maintain the current IA therein. The resistance of the transistor 78 will therefore be maintained as $R_{78}=V_{REF}/IA$.

The respective bases of NPN transistors 66 and 70 are connected to a reference voltage, $V_{CM}$, on line 82. In addition, the bases of NPN transistors 68 and 72 are connected to a reference voltage, $V_{REF}$. The matched components provided in the various current mirrors of the circuit 50 provide a voltage at its output on line 80 that causes the resistance of element 78 to be essentially temperature independent over a temperature range of interest, and is sufficiently accurate to control the transconductance circuit 10 of FIG. 1.

Figure 3:
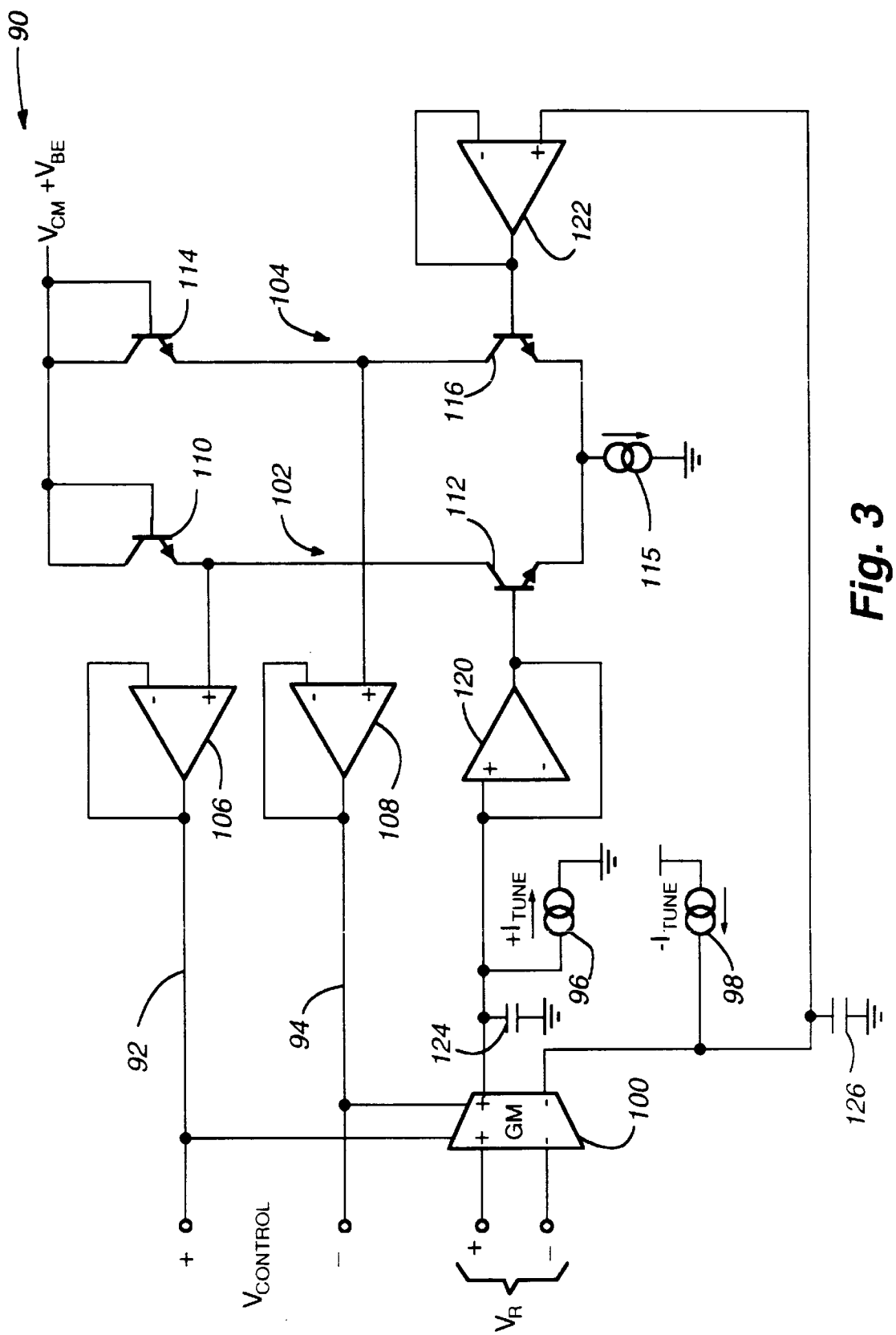
FIG. 3 is an electrical schematic diagram of a circuit for providing a control voltage for application to the transconductance circuit of FIG. 1.

As mentioned above, the programmable control voltage, $V_{CONTROL}$, is provided on lines 92 and 94 from the circuit 90, shown in FIG. 3. More specifically, the voltage, $V_{CONTROL}$, that is provided on the voltage control lines 92 and 94 can be controlled by varying the currents, $+I_{TUNE}$ and $-I_{TUNE}$, supplied by respective current sources 96 and 98. The current sources 96 and 98 are matched, and are temperature independent, and are connected to the differential outputs terminals of a transconductance circuit 100, which serves as a "master" transconductance circuit. The transconductance circuit 100 may be constructed in manner similar to that of the transconductance circuit 10 of FIG. 1, receiving at its voltage input terminals a reference voltage, $V_R$, which may be a temperature compensated voltage reference, and receiving at its control voltage ($V_{CONTROL}$) input the voltage developed on lines 92 and 94.

The output from the master transconductance circuit 100 is connected to control the ratio of the currents that flow in current flow paths 102 and 104, which, as indicated above, is dependent upon the currents provided by the tuning current sources 96 and 98. The current flow path 102 includes a predistortion diode-connected NPN transistor 110 and an input NPN transistor 112 connected in series. Likewise, the current flow path 104 includes a predistortion diode-connected NPN transistor 114 and an input NPN transistor 116 connected in series. The supply voltage applied to the NPN transistors 110 and 114 is $V_{CM}+V_{BE}$. A current source 115 of magnitude of about the current source 20 or 22 in the circuit 10 of FIG. 1 is connected from the emitters of the NPN transistors 112 and 166 to ground. Thus, the output voltage, $V_{CONTROL}$, will be essentially a differential voltage, centered on $V_{CM}$.

The plus and minus differential outputs from the master transconductance circuit 100 are connected to the respective bases of NPN transistors 112 and 116 by respective noninverting buffer amplifiers 120 and 122. Capacitors 124 and 126 are provided to insure that the loop is stable. Thus, the currents that flow in the current flow paths 102 and 104 produce voltages that are buffered by buffer amplifiers 106 and 108 on the respective positive and negative output lines 92 and 94. In addition, the voltages produced on the output lines 92 and 94 are fed back to the master transconductance circuit 100 for application to the voltage control ($V_{CONTROL}$) terminals of the master transconductance circuit 100, as mentioned. The transconductance of the master transconductance circuit 100, therefore, will be determined by the ratio of the current of one of the matched current sources 96 or 98 divided by the reference voltage, $V_R$, i.e., $$gm_{100}=I_{96}/V_R=I_{98}/V_R.$$

It should be noted although the various currents in the loop of the circuit 90, such as the currents in current flow paths 102 and 104 may be temperature dependent, the transconductance of the master transconductor circuit 100 is nevertheless temperature independent. Thus, the output voltage, $V_{CONTROL}$, will establish the proper transconductance of the circuit 10 in FIG. 1, regardless of temperature variations in the respective circuits.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A programmably variable transconductance circuit, comprising:

first and second current control input devices, each having an input to which a differential input voltage is applied;

a pair of current steering circuits each connected in series with a respective one of said first and second current control devices for establishing a current division by dividing respective currents in said first and second current control devices between a differential output current path and another current flow path;

a first voltage source connected to control said current division by said current steering circuits;

a dynamically controllable resistance connected between said first and second current control input devices;

and a second voltage source connected to said dynamically controllable resistance to adjust said dynamically controllable resistance to a constant value.

2. The transconductance circuit of claim 1 wherein said dynamically controllable resistance is an MOS transistor.

3. The transconductance circuit of claim 2 wherein said MOS transistor is configured to operate in a linear range.

4. The transconductance circuit of claim 2 further comprising a gate element of said MOS transistor for application of a voltage by a voltage source.

5. The transconductance circuit of claim 4 wherein said voltage source comprises circuitry for stabilizing said voltage applied to said gate element of said MOS transistor over a desired range of operating temperatures.

6. The transconductance circuit of claim 1 wherein said first and second current control devices are bipolar transistors.

7. The transconductance circuit of claim 6 wherein said bipolar transistors are NPN transistors.

8. The transconductance circuit of claim 1 wherein said pair of current steering circuits each comprise a pair of bipolar transistors, one connected in series with a differential output line and another being connected in series with a power supply.

9. The transconductance circuit of claim 8 wherein said pair of bipolar transistors, are NPN transistors.

10. A circuit for providing a programmably variable transconductance, comprising:

first and second current flow paths;

first and second current control devices respectively connected to control currents in said first and second current flow paths, each of said first and second current control devices having a control input element to which a differential input voltage is applied;

a pair of current steering circuits each connected in series with a respective one of said first and second current flow paths, each current steering circuit being connected to establish a current division by dividing a current in said respective one of said first and second current flow paths between a respective output current path and another current flow path;

a first voltage source connected to programmably control said division of said pair of current steering circuits;

a dynamically controllable resistance providing element connected between said first and second current flow paths;

and a second voltage control source connected to said dynamically controllable resistance to adjust said dynamically controllable resistance to provide a constant resistance over desired operating transconductance ranges.

11. The transconductance circuit of claim 10 wherein said controllable resistance providing element is an MOS transistor configured to operate in a linear range.

12. The transconductance circuit of claim 11 further comprising a gate element of said MOS transistor for application of a voltage by a voltage source.

13. The transconductance circuit of claim 12 wherein said voltage source comprises circuitry for stabilizing said voltage applied said gate element of said MOS transistor over a desired range of operating temperatures.

14. The transconductance circuit of claim 10 wherein said first and second current control devices are bipolar transistors.

15. The transconductance circuit of claim 14 wherein said bipolar transistors are NPN transistors.

16. The transconductance circuit of claim 10 wherein said pair of current steering circuits each comprise a pair of bipolar transistors, one connected in series with an output line and another being connected in series with a power supply.

17. The transconductance circuit of claim 16 wherein said pair of bipolar transistors, are NPN transistors.

18. A method for programmably varying a transconductance of a circuit, comprising:

steering first and second input voltages by establishing a current division between a respective first and second differential output current path and another current flow path;

programmably controlling said current division;

dynamically controlling a resistance between said first and second differential output current paths to provide a constant value.

19. The method of claim 18 wherein said step of dynamically controlling a resistance between said first and second differential output current paths to provide a constant value comprises dynamically controlling an MOS transistor.

20. The method of claim 19 wherein said step of dynamically controlling an MOS transistor comprises configuring said MOS transistor to operate in a linear range.

21. The method of claim 19 wherein said step of dynamically controlling an MOS transistor comprises applying a voltage to a gate element of said MOS transistor.

22. The method of claim 21 wherein said step of dynamically controlling an MOS transistor comprises stabilizing said voltage applied to said gate element of said MOS transistor over a desired range of operating temperatures.

* * * * *